(12) United States Patent
Audette et al.

(10) Patent No.: US 11,662,366 B2
(45) Date of Patent: May 30, 2023

(54) WAFER PROBE WITH ELASTOMER SUPPORT

(71) Applicant: International Business Machines Corporation, Armonk, NY (US)

(72) Inventors: David Michael Audette, Colchester, VT (US); Grant Wagner, Jericho, VT (US); Jacob Louis Moore, Milton, VT (US); Peter William Neff, Cambridge, VT (US)

(73) Assignee: International Business Machines Corporation, Armonk, NY (US)

(*) Notice: Subject to any disclaimer, the term of this patent is extended or adjusted under 35 U.S.C. 154(b) by 51 days.

(21) Appl. No.: 17/480,230

(22) Filed: Sep. 21, 2021

(65) Prior Publication Data

US 2023/0089411 A1 Mar. 23, 2023

(51) Int. Cl.
*G01R 1/073* (2006.01)
*G01R 31/28* (2006.01)
*G01R 3/00* (2006.01)

(52) U.S. Cl.
CPC ........... *G01R 1/07314* (2013.01); *G01R 3/00* (2013.01); *G01R 31/2831* (2013.01)

(58) Field of Classification Search
CPC ... G01R 1/07314; G01R 3/00; G01R 31/2831
See application file for complete search history.

(56) References Cited

U.S. PATENT DOCUMENTS

| | | | |
|---|---|---|---|
| 5,642,056 A | 6/1997 | Nakajima et al. | |
| 6,166,552 A | 12/2000 | O'Connell | |
| 6,509,751 B1 * | 1/2003 | Mathieu | G01R 1/07307 324/755.05 |
| 6,791,171 B2 | 9/2004 | Mok et al. | |
| 6,970,005 B2 | 11/2005 | Rincon et al. | |

(Continued)

FOREIGN PATENT DOCUMENTS

| | | |
|---|---|---|
| CN | 102116779 A | 7/2011 |
| CN | 110120357 A | 8/2019 |
| WO | 2005103740 A2 | 11/2005 |

OTHER PUBLICATIONS

List of IBM Patents or Patent Applications Treated as Related; (Appendix P), Filed Nov. 30, 2021; 2 pages.

(Continued)

*Primary Examiner* — Paresh Patel
(74) *Attorney, Agent, or Firm* — Cantor Colburn LLP; Samuel Waldbaum

(57) ABSTRACT

A wafer test device includes a test interconnect to interface with a microcircuit of the wafer at a first side and an interposer to interface with the test interconnect at a second side of the test interconnect, opposite the first side. The interposer connects the test interconnect, via a printed circuit board (PCB), to a test apparatus that determines and controls test patterns that are applied to the microcircuit via the test interconnect. A support structure supports the test interconnect and the interposer. The support structure includes an inner bearing to tilt the test interconnect to match a tilt of a surface of the microcircuit. An elastomer between the test interconnect and the interposer reduces deflection of the test interconnect during a process of connecting the test interconnect to the microcircuit.

20 Claims, 6 Drawing Sheets

(56) References Cited

U.S. PATENT DOCUMENTS

| | | | |
|---|---|---|---|
| 7,086,149 B2 | 8/2006 | Eldridge et al. | |
| 7,812,626 B2 | 10/2010 | Bottoms et al. | |
| 8,405,414 B2 | 3/2013 | Durbin et al. | |
| 8,485,418 B2 * | 7/2013 | Eldridge | B23K 20/004 228/180.5 |
| 2002/0024354 A1 | 2/2002 | Pietzschmann | |
| 2003/0006790 A1 | 1/2003 | Holcombe | |
| 2005/0156611 A1 | 7/2005 | Shinde et al. | |
| 2006/0249857 A1 | 11/2006 | Haba et al. | |
| 2007/0040565 A1 | 2/2007 | Jayabalan et al. | |
| 2011/0074080 A1 | 3/2011 | Di Stefano et al. | |
| 2014/0167801 A1 | 6/2014 | Audette et al. | |
| 2017/0108547 A1 | 4/2017 | Appinger et al. | |
| 2020/0211922 A1 | 7/2020 | Chun et al. | |
| 2021/0080486 A1 | 3/2021 | Audette et al. | |
| 2021/0082860 A1 | 3/2021 | Audette et al. | |

OTHER PUBLICATIONS

Shubin et al., "Integrating Through-Silicon Vias with Solder Free, Compliant Interconnects for Novel, Large Area Interposers", 2012 IEEE 62nd Electronic Components and Technology Conference, 2012, pp. 263-267.

International Search Report; International Application No. PCT/CN2022/105395; International Filing Date: Jul. 13, 2022 dated Sep. 28, 2022; 10 pages.

International Search Report and Written Opinion for PCT Application No. PCT/CN2022/108547, dated Sep. 7, 2022, pp. 1-9.

* cited by examiner

WAFER PROBE WITH ELASTOMER SUPPORT

BACKGROUND

The present invention generally relates to wafer testing, and more specifically, to a wafer probe with an elastomer support.

A wafer is a semiconductor layer used for the fabrication of integrated circuits. The wafer serves as a substrate for microcircuits of microelectronic devices that are built in and on the wafer and that make up the integrated circuits. During fabrication, wafer testing is performed to identify any functional defects in the microelectronic devices. A probe device that can be referred to as a wafer probe is used to perform automated testing. For electrical testing, a set of contacts or probes of the probe device are held in electrical contact with contact points or solder bumps of the microelectronic devices of each microcircuit in turn. Once testing is completed, individual integrated circuits are obtained through a process referred to as dicing. The dicing separates each microcircuit as a die which is then packaged as an integrated circuit.

SUMMARY

Embodiments of the present invention are directed to a wafer probe with an elastomer support. A non-limiting example wafer test device includes a test interconnect to interface with a microcircuit of the wafer at a first side and an interposer to interface with the test interconnect at a second side of the test interconnect, opposite the first side. The interposer connects the test interconnect, via a printed circuit board (PCB), to a test apparatus that determines and controls test patterns that are applied to the microcircuit via the test interconnect. The wafer test device also includes a support structure to support the test interconnect and the interposer. The support structure includes an inner bearing configured to tilt the test interconnect to match a tilt of a surface of the microcircuit. An elastomer between the test interconnect and the interposer reduces deflection of the test interconnect during a process of connecting the test interconnect to the microcircuit.

Other embodiments of the present invention pertain to methods of assembling a wafer probe with an elastomer support.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

The diagrams depicted herein are illustrative. There can be many variations to the diagrams or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

DETAILED DESCRIPTION

As previously noted, wafer testing is performed prior to dicing, which separates each microcircuit for packaging as an integrated circuit. Wafer testing involves a wafer probe whose probes are held in electrical contact with solder bumps of the microelectronic devices of each microcircuit in turn. A wafer probe may include vertical probes such as buckling beam needles or may include an array of rigid probes mounted on a rigid substrate. The rigid probes may be copper and may be plated (e.g., nickel or gold plating). Unlike the compliant (i.e., individually flexing) vertical probes, the rigid probes are not limited in the power they can convey to the microelectronic devices of each microcircuit of the wafer. In addition, the cost of manufacturing a rigid probe device is relatively less than the cost of manufacturing a vertical probe card, for example. This is because the rigid probes, unlike the vertical probes, may be fabricated using photolithography.

While rigid probes facilitate conveying more power than flexible vertical probes, the lack of deformation in any aspect of the probe device can create issues in sufficiently coupling to a microcircuit that is not completely flat. The support structure of the wafer probe may facilitate a tilt in the rigid substrate to which the rigid probes are mounted. This facilitates matching a tilt in a non-planar microcircuit to achieve an electrical contact between the rigid probes and the solder bumps of the microcircuit. The rigid structure (e.g., laminate structure) to which the rigid probes are mounted is part of an interconnect between the microcircuit under test and test apparatus that controls the testing. Under certain load conditions, deflection of the interconnect may lead to a gap between the rigid probes and the solder bumps. Embodiments of the invention relate to a wafer probe with an elastomer support. A pre-compressed elastomer is included between the interconnect and an interposer that couples the interconnect to the test apparatus. The elastomer supports the interconnect in a way that minimizes deflection of the interconnect under load while allowing proper interposer compression.

Figure 1:
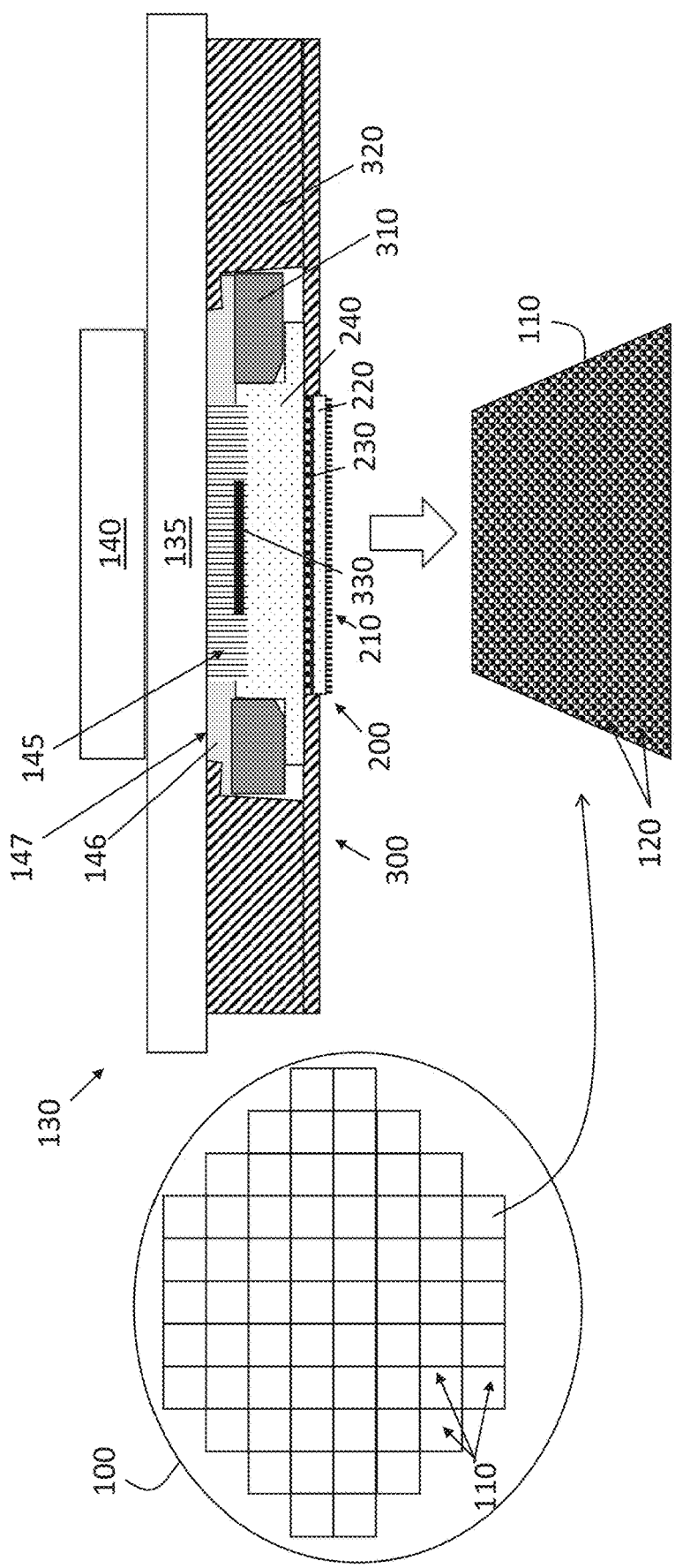
FIG. 1 depicts a wafer and corresponding wafer test components according to one or more embodiments of the invention.

FIG. 1 depicts a wafer 100 and corresponding wafer test components 130 according to one or more embodiments of the invention. A wafer 100 can include a number of microcircuits 110 that are tested in turn. A microcircuit 110 may be on the order of 1 square-inch, for example, and is shown to include a number of solder bumps 120 that function as contact points to test the microcircuit 110. The wafer 100 may be supported and moved into place for testing by a wafer prober (not shown).

A cross-sectional view of the wafer test components 130 is shown. More particularly, a portion of an outer bearing 320 of a support structure 300 is cut away. The wafer test components 130 include a test interconnect 200 that acts as an electrical and mechanical interface between the microcircuit 110 under test and the test apparatus 140 that controls the testing. That is, the test apparatus 140 determines and controls the test patterns that are applied to the microcircuit 110 under test through the test interconnect 200. The test interconnect 200 is supported by a support structure 300 that includes an inner bearing 310 and an outer bearing 320.

The test interconnect 200 includes a thin flexible laminate structure 220 and a thicker stiff laminate structure 240 that are connected by a connecting layer 230. The connecting layer 230 is further detailed with reference to FIG. 2. On one side of the test interconnect 200, rigid probes 210 extend from the laminate structure 220 to couple to the solder bumps 120 of the microcircuit 110 under test. On an opposite side of the test interconnect 200, floating pins 145 (e.g., pogo pins or spring-loaded pins) extend from a housing 146 to act as an interposer 147 coupling the laminate structure 240 to a printed circuit board (PCB) 135, as shown. The test apparatus 140 couples to the PCB 135. As FIG. 1 indicates, an elastomer 330 is included between the interposer 147 and the laminate structure 240 according to one or more embodiments of the invention. The support structure 300 and elastomer 330 are further detailed with reference to FIG. 3.

The test apparatus 140 refers to the processor, memory, and other components that control the test patterns that are implemented on each microcircuit 110 under test. For example, the test apparatus 140 can include an automatic test pattern generator (ATPG) that applies a sequence of signals to the microcircuit 110 under test via the test interconnect 200. The test apparatus 140 distinguishes between correct circuit behavior induced by the sequence of signals and faulty circuit behavior that indicates defects in the microcircuit 110 under test. As previously noted, the test apparatus 140 may connect to a PCB 135 that couples to the test interconnect 200. The test apparatus 140 may control the signals that are provided to the microcircuit 110 under test through the test interconnect 200 and, more specifically, each rigid probe 210.

The laminate structure 220 matches in size approximately to each microcircuit 110 of the wafer 100. The laminate structure 240 can have a larger area than a microcircuit 110 and facilitate a change in scale such that the PCB 135 that is larger than a microcircuit 110 can be coupled to the microcircuit 110 through the test interconnect 200. The floating pins 145 couple to the laminate structure 240 of the test interconnect 200 on one side and to the PCB 135 on the other side, facilitating coupling between the test interconnect 200 and the PCB 135. The rigid probes 210 that extend from the laminate structure 220 of the test interconnect 200 facilitate coupling between the test interconnect 200 and the microcircuit 110 under test. Each solder bump 120 of the microcircuit 110 is contacted and deformed by a rigid probe 210.

Generally, in order to perform wafer testing, the wafer 100 is moved to establish contact between the solder bumps 120 of a microcircuit 110 and the rigid probes 210 of the test interconnect 200. In order to perform testing accurately, electrical contact must be established between each solder bump 120 of the microcircuit 110 and each corresponding rigid probe 210 of the test interconnect 200. Specifically, each rigid probe 210 must contact and deform the corresponding solder bump 120. A challenge to establishing sufficient contact is the fact that the microcircuit 110 may not be completely flat but may, instead, include a slope. As a result, the solder bumps 120 may not be completely flat but, instead, exhibit the same slope.

The support structure 300 is known and, specifically, the inner bearing 310 facilitates a tilt in the test interconnect 200 so that the rigid probes 210 matches the slope in the solder bumps 120 to establish contact between the two. The inner bearing 310 and outer bearing 320 of the support structure 300 interface with each other on a spherical surface to allow for this gimbal behavior. According to one or more embodiments of the invention, the elastomer 330 supports the test interconnect 200 to reduce deflection and ensure that the rigid probes 210 and the solder bumps 120 maintain sufficient contact, regardless of differences in topology across the rigid probes 210 and solder bumps 120 under test load.

Figure 2:
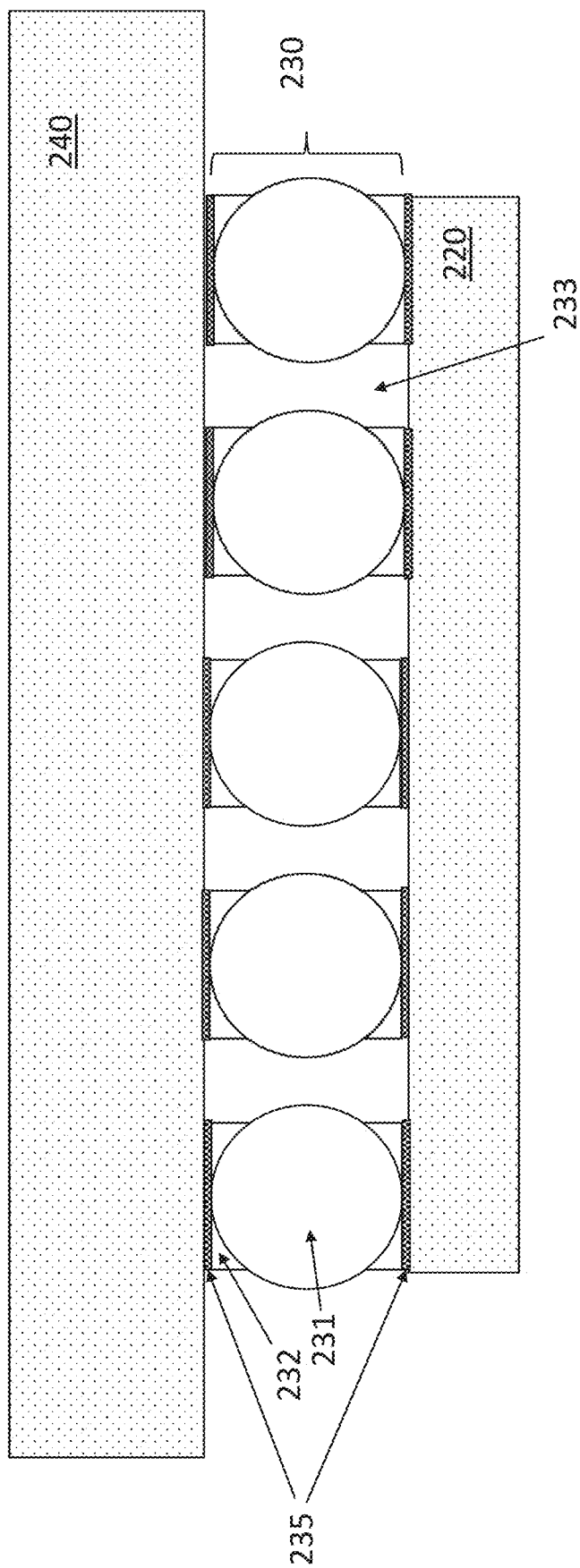
FIG. 2 details the connecting layer of the wafer test components according to one or more embodiments of the invention.

FIG. 2 details the connecting layer 230 of the wafer test components 130 according to one or more embodiments of the invention. The connecting layer 230 between the laminate structures 220, 240 may be rigid rather than compliant and include copper ball 231 held in place by solder 232. As shown, the laminate structures 220, 240 include pads 235 (e.g., gold-plated pads) to which the copper ball 231 may be soldered. Epoxy 233 may be used to fill the gaps between the copper balls 231. Because the connecting layer 230 is not compliant, the tilt in the rigid probes 210 that are mounted to the laminate structure 220, which is facilitated by the inner bearing 310, will translate to the laminate structure 240. According to one or more embodiments of the invention, the elastomer 330 is compliant enough to allow for this tilt behavior, while being rigid enough to provide support for the interconnect 200, as further detailed.

Figure 3:
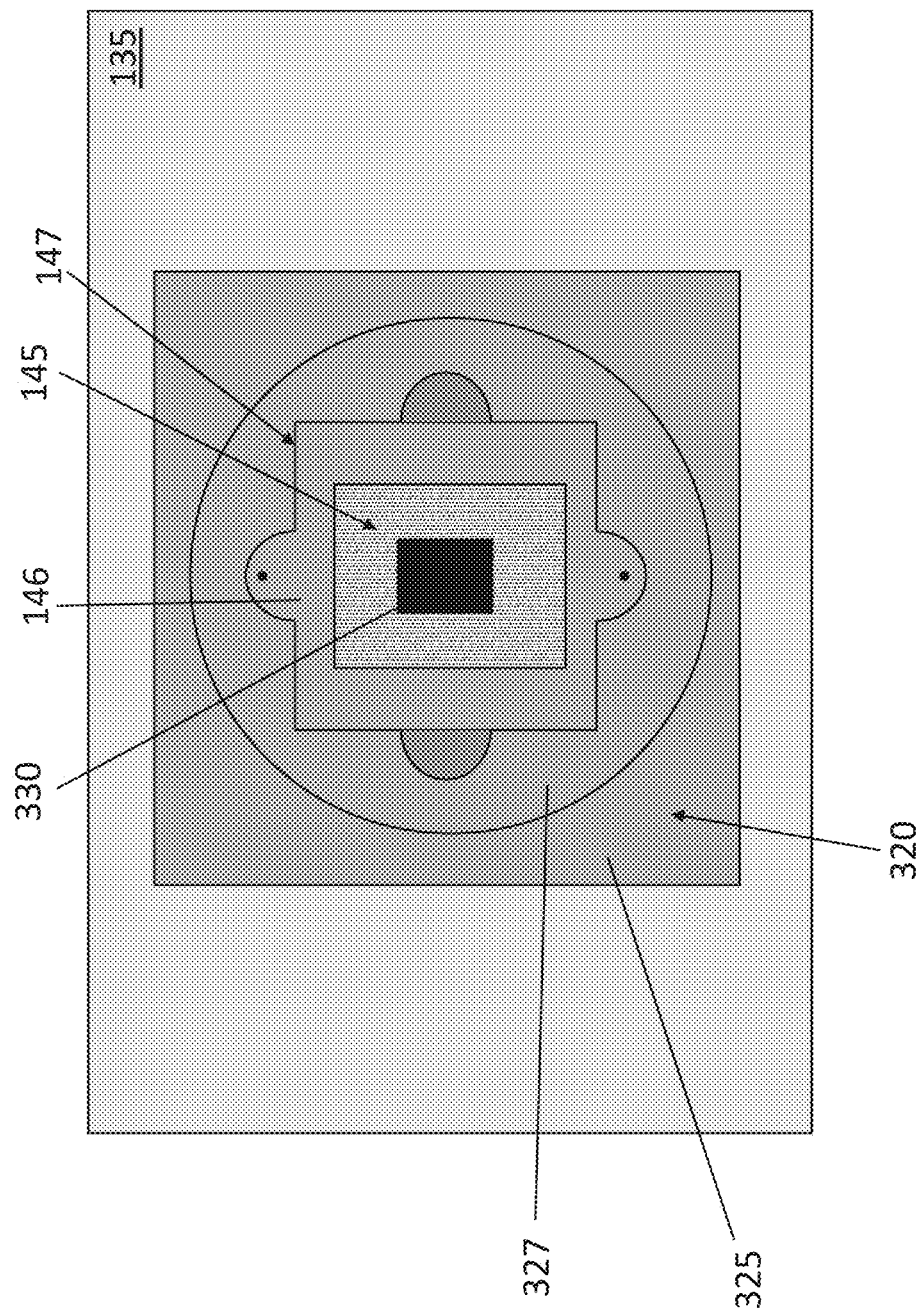
FIG. 3 details the support structure of the wafer test components that includes the elastomer according to one or more embodiments of the invention.

FIG. 3 details aspects of the support structure 300, the interposer 147, and the elastomer 330 of the wafer test components 130 according to one or more embodiments. From the perspective shown in FIG. 1, the view in FIG. 3 is a perpendicular bottom-up look from the elastomer 330. As shown, the elastomer 330 is placed in series with the interposer 147 aligned with the floating pins 145. The housing 146 of the interposer 147 may be affixed to the outer bearing 320. As shown, the outer bearing 320 may include an outer area 325 and an inner area 327. In the exemplary illustration, the outer area 325 has a rectangular perimeter, while the inner area 327 is formed by removing a cylindrical portion and, thus, has a circular perimeter.

Figure 4:
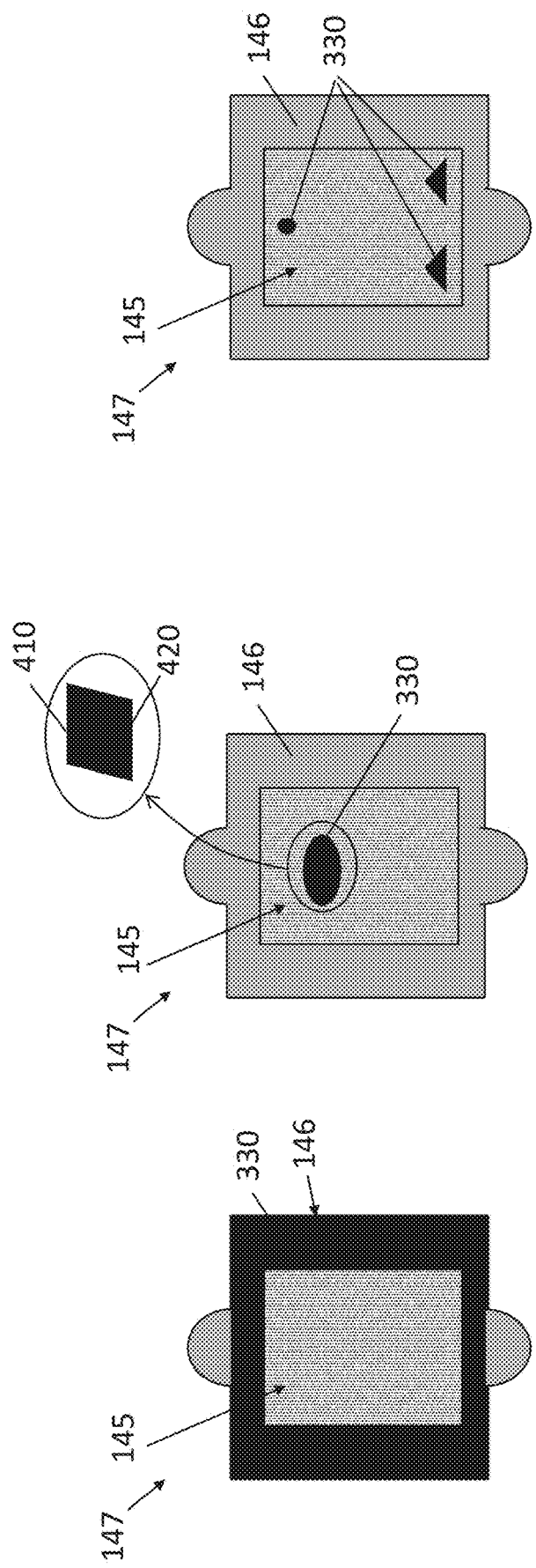
FIG. 4A illustrates an arrangement of the elastomer according to an exemplary embodiment of the invention.
FIG. 4B illustrates an arrangement of the elastomer according to an exemplary embodiment of the invention.
FIG. 4C illustrates an arrangement of the elastomer according to an exemplary embodiment of the invention.

The housing 146 is affixed to the inner area 327 and, according to the arrangement shown in FIG. 1, the laminate structure 240 fits within the inner area 327 and couples to the interposer 147 (i.e., floating pins 145). Also according to the exemplary arrangement, the elastomer 330 is between the laminate structure 240 and the interposer 147 in a center portion. Other exemplary arrangements of the elastomer 330 are discussed with reference to FIG. 4. When the rigid probes 210 mounted to the laminate structure 220 encounter solder bumps 120 that are not on a horizontal plane according to the view in FIG. 1, the support structure 300 allows the laminate structure 220 to gimbal to accommodate the tilt needed for close coupling of the rigid probes 210 and solder bumps 120. Due to the non-compliant connecting layer 230 and the inner bearing 310, the laminate structure 240 experiences a corresponding tilt. At the opposite side of the laminate structure 240 from the connecting layer 230, the elastomer 330 ensures that the deflection of the interconnect 200 does not result in a gap between the rigid probes 210 and the solder bumps 120 (i.e., that the rigid probes 210 maintain reliable contact with the solder bumps 120).

As previously noted, the elastomer 330 supports the interconnect 200 in a way that minimizes deflection of the interconnect 200 under load while allowing proper interposer 147 compression. To achieve this, the elastomer 330 is selected with a specific compression versus load curve so that early in the loading phase, when the stiffness is low, it allows for proper interposer compression, before hardening to provide interconnect support as more test load is applied. That is, at one stage, the interposer 147 is compressed into the interconnect 200 with the elastomer 330 therebetween. The elastomer 330 is selected such that the load required for this compression is much lower than the load required for any additional compression. In a subsequent stage, when the interconnect 200, via the rigid probes 210, is compressed into the microcircuit 110, via the solder bumps 120, the elastomer 330 provides a rigid support to minimize deflection of the interconnect 200. Exemplary characteristics of the elastomer 330 that may be considered are thickness, elastic modulus, size, location on the interposer 147, and a number of components. This is further discussed with reference to FIGS. 4A, 4B, and 4C. The elastomer 330 may also be selected to work in conjunction with the gimbal hardware of the support structure 300.

FIGS. 4A, 4B, and 4C illustrate different arrangements of the elastomer 330 according to exemplary embodiments of the invention. As FIG. 4A shows, the elastomer 330 may be arranged around the floating pins 145 of the interposer 147 rather than on the floating pins 145, as shown in FIG. 3. While the example includes elastomer 330 all around the floating pins 145, only a portion of the housing 146 around the floating pins 145 may be covered with elastomer 330 according to alternate embodiments of the invention.

FIG. 4B shows elastomer 330 on the floating pins 145, as in the exemplary illustration in FIG. 3, but oval rather than rectangular and off-center rather than centered on the floating pins 145. An enlarged side view of the elastomer 330 is also provided. This side view shows the elastomer-interconnect surface 410, which is the surface of the elastomer 330 that contacts the interconnect 200 and also shows the elastomer-interposer surface 420, which is the surface of the elastomer 330 that contacts the interposer 147. In each of the examples, a thickness of the elastomer 330 may be selected to allow lateral movement of the elastomer 330 (i.e., the elastomer-interconnect surface 410 may shift laterally relative to the elastomer-interposer surface 420, as indicated) during the stage in which the interconnect 200 and interposer 147 are coupled with the elastomer 330 therebetween.

The specific location, shape, and size of the elastomer 330 may be based on the fact that one portion or side of the microcircuit 110 has more solder bumps 120 than another. That is, an area of the rigid probes 210 for which a higher load is required because of a correspondence to a higher density of solder bumps 120 may dictate that the elastomer 330 be located on the side of the floating pins 145 that corresponds to the side of the higher density solder bumps 120.

FIG. 4C shows the elastomer 330 arranged as three components. The components that make up the elastomer 330 may have the same thickness but may have a different elastic modulus based on their location. As shown, the different components of the elastomer 330 may also have different shapes and sizes.

Figure 5:
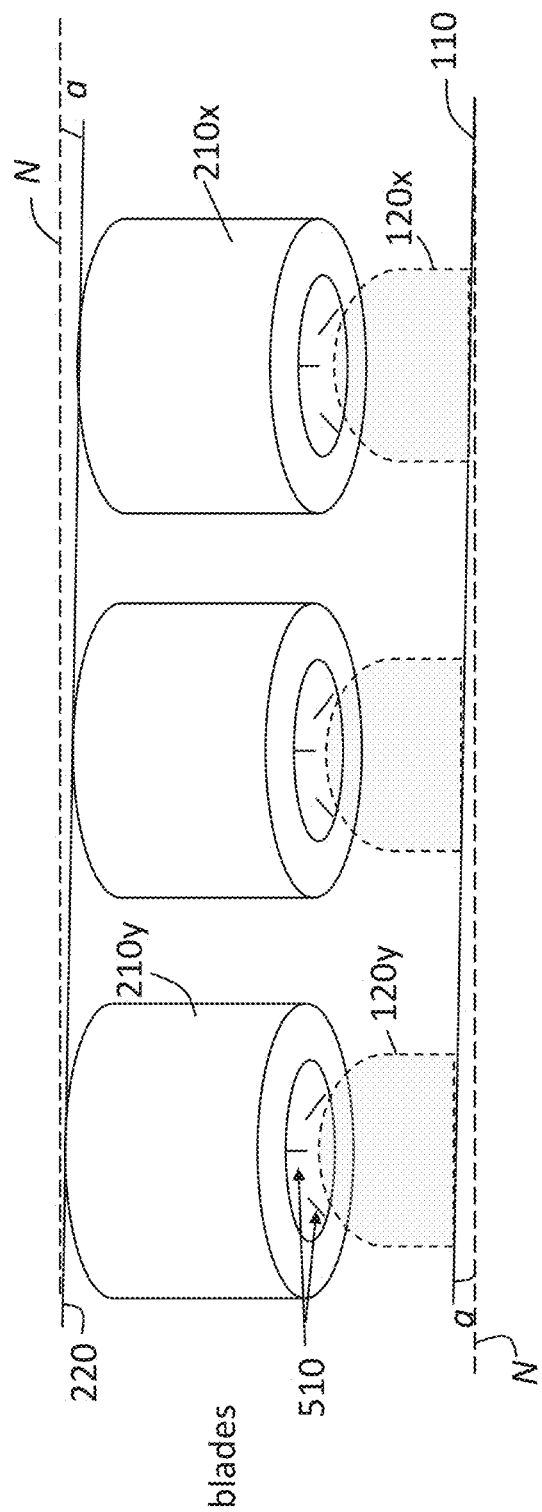
FIG. 5 illustrates an exemplary scenario that gives rise to a wafer probe with an elastomer according to one or more embodiments of the invention.

FIG. 5 illustrates an exemplary scenario that gives rise to a wafer probe with an elastomer 330 according to one or more embodiments of the invention. A set of solder bumps 120 of a microcircuit 110 and corresponding rigid probes 210 mounted to the laminate structure 220 are shown. Each rigid probe 210 is shown to have a cylindrical shape and to include blades 510. When the microcircuit 110 is moved into contact with the wafer test components 130, the blades 510 of each rigid probe 210 contact and deform the corresponding solder bump 120 in order to establish electrical contact. As FIG. 5 illustrates, the surface of the microcircuit 110 is tilted at an angle α relative to a normal surface N (e.g., the surface of the wafer prober that holds the wafer 100 in place for testing). This results in the tops of the solder bumps 120 also not being flat relative to the normal surface N.

Based on the inner bearing 310 facilitating a tilt in the test interconnect 200, the laminate structure 220 to which the rigid probes 210 are mounted also tilts at an angle a, as shown. As a result, each rigid probe 210 makes electrical contact with each corresponding solder bump 120. Without this corresponding tilt, the rigid probe 210x, for example, may be farther from the corresponding solder bump 120x than the rigid probe 210y is from the corresponding solder bump 120y based on the tilt in the surface of the microcircuit 110. The elastomer 330 that supports the opposite side of the test interconnect 200 (i.e., the side with the laminate structure 240 rather than the side with the laminate structure 220), shown in FIG. 1, ensures that sufficient contact is maintained between the rigid probes 210 and the solder bumps 120, regardless of differences in topology under test load. As a result, the connection from the test apparatus 140 through to the microcircuit 110 is maintained during wafer testing.

Figure 6:
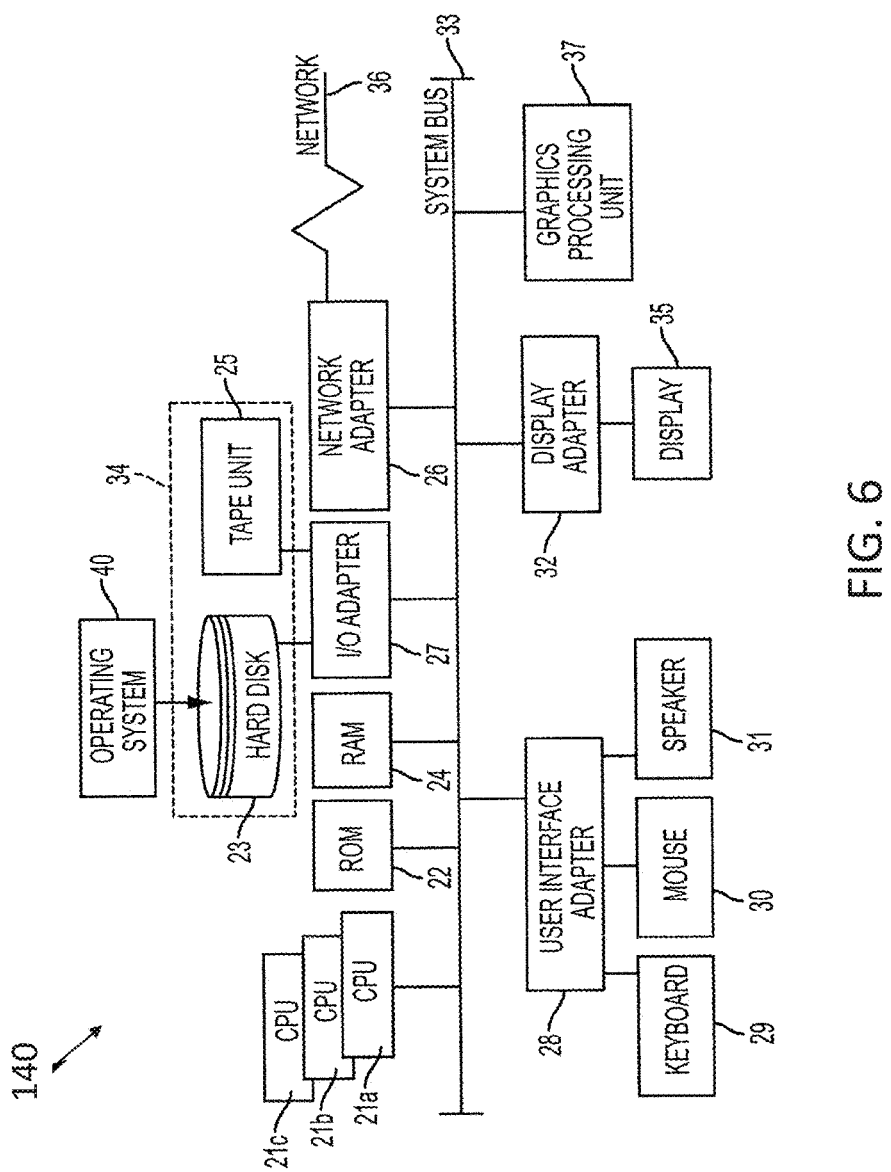
FIG. 6 is a block diagram of aspects of the test apparatus used with a wafer probe that includes an elastomer according to one or more embodiments of the invention.

FIG. 6 is a block diagram of aspects of the test apparatus 140. As previously noted, the test apparatus 140 generates the test patterns used to test the microcircuit 110 to which the test apparatus 140 is coupled through the test interconnect 200. The test apparatus 140 includes one or more central processing units (processors) 21a, 21b, 21c, etc. (collectively or generically referred to as processor(s) 21 and/or as processing device(s)). According to one or more embodiments of the present invention, each processor 21 can include a reduced instruction set computer (RISC) microprocessor. Processors 21 are coupled to system memory (e.g., random access memory (RAM) 24) and various other components via a system bus 33. Read only memory (ROM) 22 is coupled to system bus 33 and can include a basic input/output system (BIOS), which controls certain basic functions of the test apparatus 140.

Further illustrated are an input/output (I/O) adapter 27 and a communications adapter 26 coupled to system bus 33. I/O adapter 27 can be a small computer system interface (SCSI) adapter that communicates with a hard disk 23 and/or a tape storage drive 25 or any other similar component. I/O adapter 27, hard disk 23, and tape storage device 25 are collectively referred to herein as mass storage 34. Operating system 40 for execution on test apparatus 140 can be stored in mass storage 34. The RAM 22, ROM 24, and mass storage 34 are examples of memory 19 of the test apparatus 140. A network adapter 26 interconnects system bus 33 with an outside network 36 enabling the test apparatus 140 to communicate with other such systems.

A display (e.g., a display monitor) 35 is connected to system bus 33 by display adaptor 32, which can include a graphics adapter to improve the performance of graphics intensive applications and a video controller. According to one or more embodiments of the present invention, adapters 26, 27, and/or 32 can be connected to one or more I/O busses that are connected to system bus 33 via an intermediate bus bridge (not shown). Suitable I/O buses for connecting peripheral devices such as hard disk controllers, network adapters, and graphics adapters typically include common protocols, such as the Peripheral Component Interconnect (PCI). Additional input/output devices are shown as connected to system bus 33 via user interface adapter 28 and display adapter 32. A keyboard 29, mouse 30, and speaker 31 can be interconnected to system bus 33 via user interface adapter 28, which can include, for example, a Super I/O chip integrating multiple device adapters into a single integrated circuit.

According to one or more embodiments of the present invention, the test apparatus 140 includes a graphics processing unit 37. Graphics processing unit 37 is a specialized electronic circuit designed to manipulate and alter memory to accelerate the creation of images in a frame buffer intended for output to a display. In general, graphics processing unit 37 is very efficient at manipulating computer graphics and image processing and has a highly parallel structure that makes it more effective than general-purpose CPUs for algorithms where processing of large blocks of data is done in parallel.

Thus, as configured herein, the test apparatus 140 includes processing capability in the form of processors 21, storage capability including system memory (e.g., RAM 24), and mass storage 34, input means such as keyboard 29 and mouse 30, and output capability including speaker 31 and display 35. According to one or more embodiments of the present invention, a portion of system memory (e.g., RAM 24) and mass storage 34 collectively store an operating system such as the AIX® operating system from IBM Corporation to coordinate the functions of the various components shown in the test apparatus 140.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

One or more of the methods described herein can be implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

In some embodiments, various functions or acts can take place at a given location and/or in connection with the operation of one or more apparatuses or systems. In some embodiments, a portion of a given function or act can be performed at a first device or location, and the remainder of the function or act can be performed at one or more additional devices or locations.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The present disclosure has been presented for purposes of illustration and description, but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The diagrams depicted herein are illustrative. There can be many variations to the diagram or the steps (or operations) described therein without departing from the spirit of the disclosure. For instance, the actions can be performed in a differing order or actions can be added, deleted or modified. Also, the term "coupled" describes having a signal path between two elements and does not imply a direct connection between the elements with no intervening elements/connections therebetween. All of these variations are considered a part of the present disclosure.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one"

and "one or more" are understood to include any integer number greater than or equal to one, i.e. one, two, three, four, etc. The terms "a plurality" are understood to include any integer number greater than or equal to two, i.e. two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A wafer test device comprising:
    a test interconnect configured to interface with a microcircuit of the wafer at a first side;
    an interposer configured to interface with the test interconnect at a second side of the test interconnect, opposite the first side, wherein the interposer connects the test interconnect, via a printed circuit board (PCB), to a test apparatus that determines and controls test patterns that are applied to the microcircuit via the test interconnect;
    a support structure configured to support the test interconnect and the interposer, wherein the support structure includes an inner bearing configured to tilt the test interconnect to match a tilt of a surface of the microcircuit; and
    an elastomer between the test interconnect and the interposer configured to reduce deflection of the test interconnect during a process of connecting the test interconnect to the microcircuit.

2. The device according to claim 1, wherein the test interconnect includes a first laminate structure on the first side, a second laminate structure on the second side, and a connection layer between the first laminate structure and the second laminate structure.

3. The device according to claim 2, wherein a first surface of the elastomer contacts the second laminate structure of the test interconnect.

4. The device according to claim 3, wherein a second surface of the elastomer contacts the interposer, and a thickness of the elastomer is selected such that the first surface is laterally shifted from the second surface during a process of connecting the test interconnect to the interposer.

5. The device according to claim 2, wherein the second laminate structure and the connection layer are rigid.

6. The device according to claim 2, wherein the connection layer includes copper balls soldered to the first laminate structure and the second laminate structure and epoxy.

7. The device according to claim 2, further comprising rigid probes mounted to the first laminate structure, wherein each of the rigid probes establishes an electrical connection with a corresponding solder bump on the surface of the microcircuit.

8. The device according to claim 1, wherein the elastomer has an elastic modulus, size, shape, and location configured to reduce the deflection of the test interconnect during the process of connecting the test interconnect to the microcircuit.

9. The device according to claim 8, wherein the elastomer is comprised of two or more components.

10. The device according to claim 9, wherein each of the two or more components of the elastomer has a different one or more of the elastic modulus, size, shape and location as others of the two or more components of the elastomer.

11. A method of assembling a wafer test device, the method comprising:
    configuring a test interconnect to interface with a microcircuit of the wafer at a first side;
    arranging an interposer to interface with the test interconnect at a second side of the test interconnect, opposite the first side, wherein the interposer connects the test interconnect, via a printed circuit board (PCB), to a test apparatus that determines and controls test patterns that are applied to the microcircuit via the test interconnect;
    arranging a support structure to support the test interconnect and the interposer, wherein the support structure includes an inner bearing configured to tilt the test interconnect to match a tilt of a surface of the microcircuit; and
    disposing an elastomer between the test interconnect and the interposer to reduce deflection of the test interconnect during a process of connecting the test interconnect to the microcircuit.

12. The method according to claim 11, wherein the configuring the test interconnect includes arranging a first laminate structure on the first side, a second laminate structure on the second side, and a connection layer between the first laminate structure and the second laminate structure.

13. The method according to claim 12, wherein the disposing the elastomer includes a first surface of the elastomer contacting the second laminate structure of the test interconnect.

14. The method according to claim 13, wherein the disposing the elastomer includes a second surface of the elastomer contacting the interposer, and the method includes selecting a thickness of the elastomer such that the first surface is laterally shifted from the second surface during a process of connecting the test interconnect to the interposer.

15. The method according to claim 12, wherein the configuring the test interconnect includes obtaining a rigid second laminate structure and the connection layer.

16. The method according to claim 12, wherein the configuring the test interconnect includes forming the connection layer to include copper balls soldered to the first laminate structure and the second laminate structure and epoxy.

17. The method according to claim 12, wherein the configuring the test interconnect includes mounting rigid probes to the first laminate structure, wherein each of the rigid probes establishes an electrical connection with a corresponding solder bump on the surface of the microcircuit.

18. The method according to claim 11, wherein the disposing the elastomer includes the elastomer having an elastic modulus, size, shape, and location to reduce the deflection of the test interconnect during the process of connecting the test interconnect to the microcircuit.

19. The method according to claim 18, wherein the disposing the elastomer includes forming the elastomer as two or more components.

20. The method according to claim 19, wherein the disposing the elastomer includes each of the two or more components of the elastomer having a different one or more of the elastic modulus, size, shape and location as others of the two or more components of the elastomer.

* * * * *